United States Patent
Tunks et al.

(10) Patent No.: US 11,099,617 B1
(45) Date of Patent: Aug. 24, 2021

(54) COMBINATION INFORMATION HANDLING RESOURCE CARRIER AND AIRFLOW BLANK

(71) Applicant: Dell Products L.P., Round Rock, TX (US)

(72) Inventors: Eric M. Tunks, Austin, TX (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/828,648

(22) Filed: Mar. 24, 2020

(51) Int. Cl.
*H05K 7/20* (2006.01)
*G06F 1/20* (2006.01)
*G06F 1/18* (2006.01)

(52) U.S. Cl.
CPC ............... *G06F 1/20* (2013.01); *G06F 1/182* (2013.01); *H05K 7/20145* (2013.01)

(58) Field of Classification Search
CPC ........ H05K 7/20145; G06F 1/185; G06F 1/20
See application file for complete search history.

(56) References Cited

U.S. PATENT DOCUMENTS

| | | | | |
|---|---|---|---|---|
| 964,146 | A * | 7/1910 | Clark | F24F 13/068 454/284 |
| 5,435,781 | A * | 7/1995 | Kitchens | F24F 13/06 454/284 |
| 9,949,408 | B2 * | 4/2018 | Chia | H05K 9/0041 |
| 2008/0291621 | A1 * | 11/2008 | Regimbal | H05K 7/20836 361/679.41 |
| 2020/0214177 | A1 * | 7/2020 | Chen | H05K 7/20145 |

* cited by examiner

*Primary Examiner* — Mukundbhai G Patel
(74) *Attorney, Agent, or Firm* — Jackson Walker L.L.P.

(57) ABSTRACT

A combination information handling resource carrier and airflow impedance blank configured to populate a slot of an information handling system may include a carrier configured to carry an information handling resource and a removable airflow impedance element mechanically coupled to the carrier and configured to be readily removed in order to convert the combination from operation as an airflow impedance blank to operation as an information handling resource carrier.

15 Claims, 3 Drawing Sheets

COMBINATION INFORMATION HANDLING RESOURCE CARRIER AND AIRFLOW BLANK

TECHNICAL FIELD

The present disclosure relates to information handling systems. More specifically, embodiments of the disclosure may combine an information handling resource carrier and an airflow impedance blank for use in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM), hard disk drives, and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Oftentimes, an information handling system chassis may be configured to receive a plurality of modular information handling resources, such as hard disk drives, in a corresponding plurality of externally-facing slots. In such a chassis, in traditional implementations, an airflow blank may sometimes be used to populate a slot not otherwise populated with an information handling resource in order to provide airflow impedance for the slot similar to an airflow impedance of an information handling resource populating the slot, in order to provide for desirable air flow of an air mover-based cooling system.

SUMMARY

In accordance with the teachings of the present disclosure, the disadvantages and problems associated with traditional approaches to controlling airflow in a chassis with information handling resource blanks have been substantially reduced or eliminated.

In accordance with embodiments of the present disclosure, a combination information handling resource carrier and airflow impedance blank configured to populate a slot of an information handling system may include a carrier configured to carry an information handling resource and a removable airflow impedance element mechanically coupled to the carrier and configured to be readily removed in order to convert the combination from operation as an airflow impedance blank to operation as an information handling resource carrier.

In accordance with these and other embodiments of the present disclosure, an information handling system may include a chassis and a combination information handling resource carrier and airflow impedance blank configured to populate a slot of the chassis. The combination may include a carrier configured to carry an information handling resource and a removable airflow impedance element mechanically coupled to the carrier and configured to be readily removed in order to convert the combination from operation as an airflow impedance blank to operation as an information handling resource carrier.

In accordance with these and other embodiments of the present disclosure, a method for forming a combination information handling resource carrier and airflow impedance blank configured to populate a slot of an information handling system may include mechanically coupling to a carrier configured to carry an information handling resource to a removable airflow impedance element configured to be readily removed in order to convert the combination from operation as an airflow impedance blank to operation as an information handling resource carrier.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 3C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more busses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
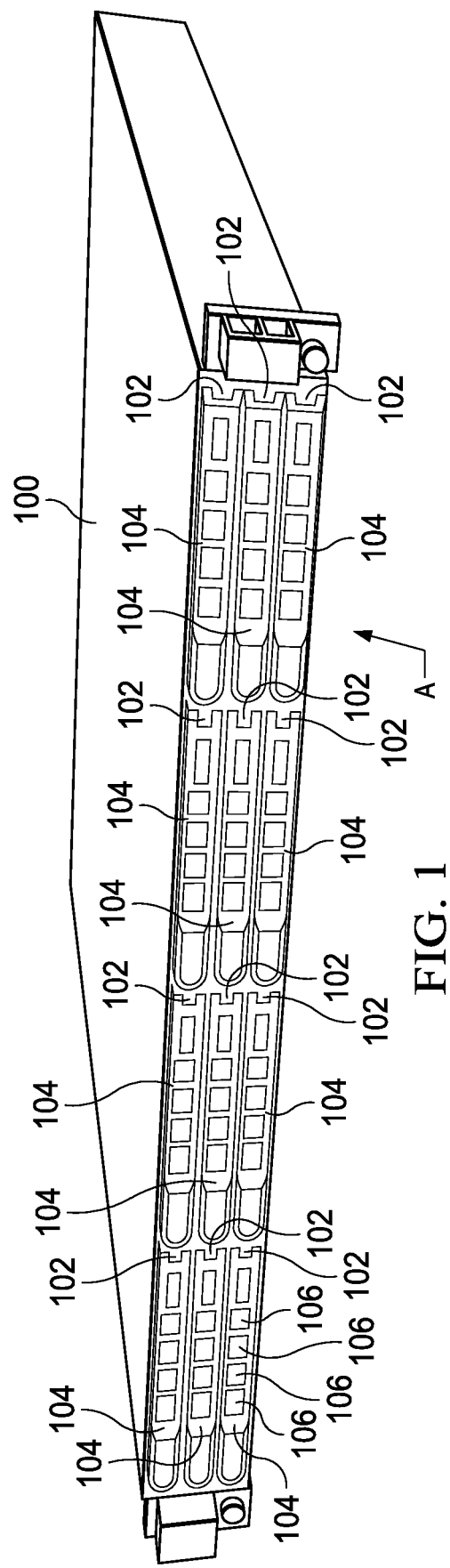
FIG. 1 illustrates a perspective view of a chassis for receiving modular information handling resources, in accordance with embodiments of the present disclosure.

FIG. 1 illustrates a perspective view of a chassis 100 for receiving modular information handling resources, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more externally-facing slots 102 each configured to receive a corresponding combination information handling resource carrier and airflow impedance blank 104. As described in greater detail below, each combination information handling resource carrier and airflow impedance blank 104 may be configured either as an information handling resource carrier (and therefore may have an information handling resource carried within) or as an airflow impedance blank that matches an airflow resistance of an information handling resource carrier populated with an information handling resource. In some embodiments, one or more combination information handling resource carriers and airflow impedance blanks 104 that are configured as information handling resource carriers may carry therein a hard disk drive or other information handling resource.

As shown in FIG. 1, each combination information handling resource carrier and airflow impedance blank 104 may include a plurality of vent holes 106 for passage and guidance of airflow.

Although it may be arbitrary to label a particular portion or side of an information handling system as a "front," "back" "top," "bottom," or "side," for purposes of clarity of exposition, the direction "A" depicted is FIG. 1 may face what will be referred to herein as the "front" of information handling system 100 and "front" of combination information handling resource carriers and airflow impedance blanks 104. Thus, while the label "front" and corresponding label "back" may be used to aid exposition, such terms are not intended to limit information handling system 100 to a particular orientation or configuration.

Figure 2A:
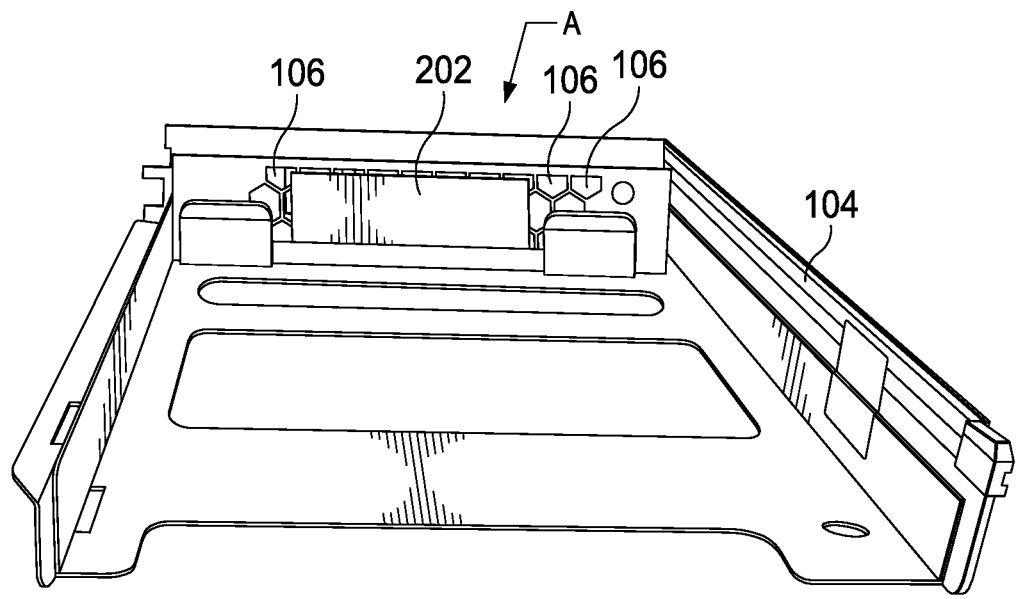
FIG. 2A illustrates a perspective view of a combination information handling resource carrier and airflow impedance blank configured for operation as an airflow impedance blank, in accordance with embodiments of the present disclosure.

FIG. 2A illustrates a perspective view from the back of a combination information handling resource carrier and airflow impedance blank 104 (e.g., opposite of the front of information handling system 100 and the fronts of combination information handling resource carriers and airflow impedance blanks 104) configured for operation as an airflow impedance blank, in accordance with embodiments of the present disclosure. As shown in FIG. 2A, when configured as an airflow impedance blank, combination information handling resource carrier and airflow impedance blank 104 may have a removable airflow impedance element 202 mechanically coupled to the remainder of combination information handling resource carrier and airflow impedance blank 104 such that removable airflow impedance element 202 fluidically blocks airflow through one or more vent holes 106. In some embodiments, removable airflow impedance element 202 may be sized (e.g., in terms of physical dimensions and/or shape) such that a combination information handling resource carrier and airflow impedance blank 104 having removable airflow impedance element 202 is matched in terms of airflow impedance to a combination information handling resource carrier and airflow impedance blank 104 having an information handling resource carried within but without removable airflow impedance element 202.

Removable airflow impedance element 202 may be mechanically coupled to the remainder of combination information handling resource carrier and airflow impedance blank 104 in any suitable manner. For example, in some embodiments, removable airflow impedance element 202 may be affixed to the remainder of combination information handling resource carrier and airflow impedance blank 104 by an adhesive present on a side of removable airflow impedance element 202.

Although not explicitly shown in FIG. 2A, in some embodiments removable airflow impedance element 202 may have information printed thereon, for example instructions regarding a necessity for leaving removable airflow impedance element 202 in place if an information handling resource is not carried within combination information handling resource carrier and airflow impedance blank 104 and/or instructions for removal of removable airflow impedance element 202. In these and other embodiments, removable airflow impedance element 202 may be of a color that allows a technician or other user to readily determine from the exterior of information handling system 100 (e.g., by looking through vent holes 106 in the direction "A" labeled in FIG. 1) whether a removable airflow impedance element 202 is present within a combination information handling resource carrier and airflow impedance blank 104.

Figure 2B:
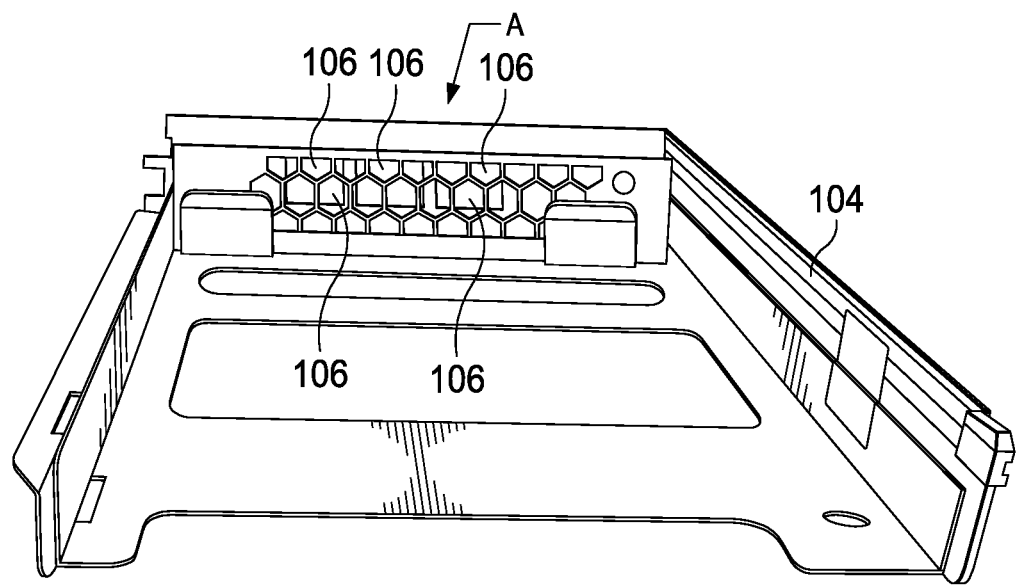
FIG. 2B illustrates a perspective view of the combination information handling resource carrier and airflow impedance blank depicted in FIG. 2 configured for operation as an information handling resource carrier, in accordance with embodiments of the present disclosure.

FIG. 2B illustrates a perspective view from the back of a combination information handling resource carrier and airflow impedance blank 104 (e.g., opposite of the front of information handling system 100 and the fronts of combination information handling resource carriers and airflow impedance blanks 104) configured for operation as an information handling resource carrier, in accordance with embodiments of the present disclosure. As suggested by comparing FIGS. 2A and 2B, a technician or other user may readily convert combination information handling resource carrier and airflow impedance blank 104 from being configured for operation as an airflow impedance blank to being configured for operation as an information handling resource carrier by removing removable airflow impedance element 202 from the remainder of combination information handling resource carrier and airflow impedance blank 104. After such removal of removable airflow impedance element 202, such technician or user may insert an information handling resource (not shown) into combination information handling resource carrier and airflow impedance blank 104.

Figure 3A:
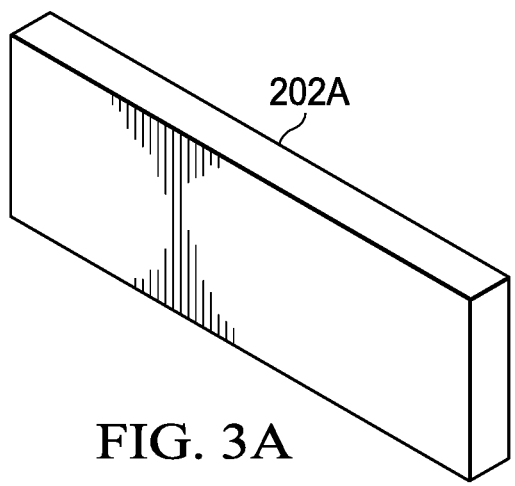
FIG. 3A illustrates a perspective view of a removable airflow impedance element in the shape of a rectangular prism, in accordance with embodiments of the present disclosure.
Figure 3B:
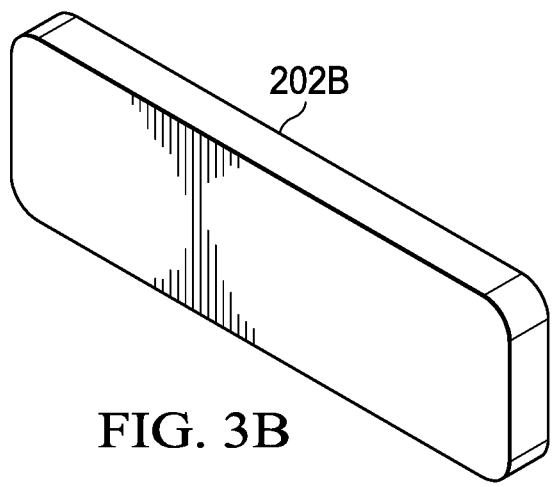
FIG. 3B illustrates a perspective view of a removable airflow impedance element in the shape of a rectangular prism with rounded edges, in accordance with embodiments of the present disclosure.
Figure 3C:
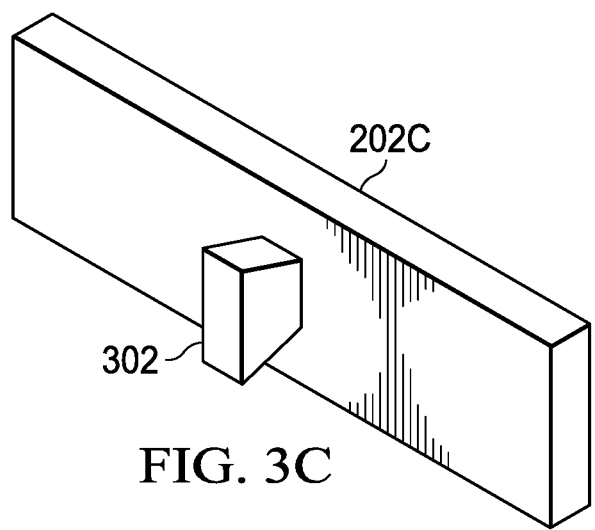
FIG. 3C illustrates a perspective view of a removable airflow impedance element in the shape of a rectangular prism with a protrusion protruding from the removable airflow impedance element, in accordance with embodiments of the present disclosure.

Removable airflow impedance element 202 may be sized (e.g., in terms of physical dimensions and/or shape) in any suitable manner. FIGS. 3A through 3C depict examples of different shapes that may be used to implement removable airflow impedance element 202. For example, as shown in FIG. 3A, a removable airflow impedance element 202A may have the shape of a rectangular prism, in accordance with embodiments of the present disclosure. In some embodiments, removable airflow impedance element 202A may have a considerably sizable length and width, but an extremely thin depth, as would be the case where removable airflow impedance element 202A is implemented as an adhesive sticker or decal.

As another example, as shown in FIG. 3B, a removable airflow impedance element 202B may have the shape of a rectangular prism with rounded edges, in accordance with embodiments of the present disclosure. In some embodiments, removable airflow impedance element 202B may have a considerably sizable length and width, but an extremely thin depth, as would be the case where removable airflow impedance element 202B is implemented as an adhesive sticker or decal.

As a further example, as shown in FIG. 3C, a removable airflow impedance element 202C may have the shape of a rectangular prism or other suitable shape with a protrusion 302 protruding therefrom (e.g., such that protrusion 302 protrudes in the direction "A" shown in FIG. 1 when combination information handling resource carrier and airflow impedance blank 104 is mounted within information handling system 100. In some embodiments, such protrusion 302 may function as a mechanical interference to prevent insertion of an information handling resource into combination information handling resource carrier and airflow impedance blank 104 when removable airflow impedance element 202C is present. In these and other embodiments, such protrusion 302 may function as a mechanical pull tab or other aid to enable a technician or other user to easily remove removable airflow impedance element 202C when desired to do so.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A combination information handling resource carrier and airflow impedance blank configured to populate a slot of an information handling system, the combination comprising:
  a carrier configured to carry an information handling resource; and
  a removable airflow impedance element mechanically coupled to the carrier and configured to be readily removed in order to convert the combination from operation as an airflow impedance blank to operation as an information handling resource carrier, wherein the removable airflow impedance element comprises a protrusion implementing a mechanical interference that prevents the information handling resource from being carried in the carrier when the removable airflow impedance element is mechanically coupled to the carrier.

2. The combination of claim 1, wherein a first airflow impedance of the combination with the removable airflow impedance element mechanically coupled to the carrier is approximately equal to a second airflow impedance of the combination without the removable airflow impedance element mechanically coupled to the carrier and the information handling resource carried in the carrier.

3. The combination of claim 1, wherein the removable airflow impedance element is mechanically coupled to the carrier via an adhesive.

4. The combination of claim 3, wherein the removable airflow impedance element comprises an adhesive sticker or decal.

5. The combination of claim 1, wherein the protrusion implements a tab for enabling a person to remove the removable airflow impedance element from the carrier.

6. An information handling system comprising:
  a chassis; and
  a combination information handling resource carrier and airflow impedance blank configured to populate a slot of the chassis, the combination comprising:
    a carrier configured to carry an information handling resource; and
    a removable airflow impedance element mechanically coupled to the carrier and configured to be readily removed in order to convert the combination from operation as an airflow impedance blank to operation as an information handling resource carrier,
  wherein the removable airflow impedance element comprises a protrusion implementing a mechanical interference that prevents the information handling resource from being carried in the carrier when the removable airflow impedance element is mechanically coupled to the carrier.

7. The information handling system of claim 6, wherein a first airflow impedance of the combination with the removable airflow impedance element mechanically coupled to the carrier is approximately equal to a second airflow impedance of the combination without the removable airflow impedance element mechanically coupled to the carrier and the information handling resource carried in the carrier.

8. The information handling system of claim 6, wherein the removable airflow impedance element is mechanically coupled to the carrier via an adhesive.

9. The information handling system of claim 8, wherein the removable airflow impedance element comprises an adhesive sticker or decal.

10. The information handling system of claim 6, wherein the protrusion implements a tab for enabling a person to remove the removable airflow impedance element from the carrier.

11. A method for forming a combination information handling resource carrier and airflow impedance blank configured to populate a slot of an information handling system, the method comprising mechanically coupling a carrier configured to carry an information handling resource to a removable airflow impedance element configured to be readily removed in order to convert the combination from operation as an airflow impedance blank to operation as an information handling resource carrier, wherein the removable airflow impedance element comprises a protrusion implementing a mechanical interference that prevents the information handling resource from being carried in the carrier when the removable airflow impedance element is mechanically coupled to the carrier.

12. The method of claim 11, further comprising matching such that a first airflow impedance of the combination with the removable airflow impedance element mechanically coupled to the carrier is approximately equal to a second airflow impedance of the combination without the removable airflow impedance element mechanically coupled to the carrier and the information handling resource carried in the carrier.

13. The method of claim 11, further comprising mechanically coupling the removable airflow impedance element to the carrier via an adhesive.

14. The method of claim 13, wherein the removable airflow impedance element comprises an adhesive sticker or decal.

15. The method of claim 11, wherein the protrusion implements a tab for enabling a person to remove the removable airflow impedance element from the carrier.

* * * * *